(12) United States Patent
Kim et al.

(10) Patent No.: US 10,170,728 B2
(45) Date of Patent: Jan. 1, 2019

(54) DISPLAY DEVICE

(71) Applicant: Samsung Display Co., Ltd., Yongin-si (KR)

(72) Inventors: Taekon Kim, Yongin-si (KR); Jungtae Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/437,671

(22) Filed: Feb. 21, 2017

(65) Prior Publication Data

US 2018/0013094 A1 Jan. 11, 2018

(30) Foreign Application Priority Data

Jul. 5, 2016 (KR) .................. 10-2016-0085066

(51) Int. Cl.
| | |
|---|---|
| *H01L 23/10* | (2006.01) |
| *H01L 51/52* | (2006.01) |
| *H01L 33/54* | (2010.01) |
| *H01L 27/32* | (2006.01) |
| *H01L 51/56* | (2006.01) |
| *H03K 17/96* | (2006.01) |

(52) U.S. Cl.
CPC .......... *H01L 51/5253* (2013.01); *H01L 23/10* (2013.01); *H01L 27/323* (2013.01); *H01L 27/3223* (2013.01); *H01L 27/3276* (2013.01); *H01L 33/54* (2013.01); *H01L 51/5246* (2013.01); *H01L 51/56* (2013.01); *H03K 17/962* (2013.01); *H01L 2227/323* (2013.01); *H01L 2251/566* (2013.01)

(58) Field of Classification Search
None
See application file for complete search history.

(56) References Cited

U.S. PATENT DOCUMENTS

| 2002/0047568 A1* | 4/2002 | Koyama ............. G09G 3/2022 315/169.3 |
| 2012/0294003 A1 | 11/2012 | Liu et al. |
| 2016/0037639 A1 | 2/2016 | Oh et al. |

FOREIGN PATENT DOCUMENTS

| JP | 2001-281675 | 10/2001 |
| JP | 2008-096836 | 4/2008 |
| JP | 2011-107556 | 6/2011 |
| KR | 10-0798310 | 1/2008 |
| KR | 10-2015-0081006 | 7/2015 |

OTHER PUBLICATIONS

Extended European Search Report dated Nov. 2, 2017, in European Application No. 17179767.3.

* cited by examiner

*Primary Examiner* — Cheung Lee
(74) *Attorney, Agent, or Firm* — H.C. Park & Associates, PLC

(57) ABSTRACT

A display device includes a substrate, an encapsulation portion on the substrate, a seal portion between the substrate and the encapsulation portion, and at least one dummy seal portion around the seal portion. The substrate and the encapsulation portion at least partially overlap each other in a first direction perpendicular to a surface of the substrate. The dummy seal portion is, when viewed in the first direction, arranged in an area between an edge of the seal portion and a boundary line of an overlapping area of the substrate and the encapsulation portion.

20 Claims, 9 Drawing Sheets

DISPLAY DEVICE

CROSS-REFERENCE TO RELATED APPLICATION

This application claims priority from and the benefit of Korean Patent Application No. 10-2016-0085066, filed on Jul. 5, 2016, which is hereby incorporated by reference for all purposes as if fully set forth herein.

BACKGROUND

Field

One or more exemplary embodiments relate to display technology, and, more particularly, to display devices.

Discussion of the Background

Display devices may be used for electronic apparatuses, such as, mobile devices (e.g., smart phones, laptop computers, digital cameras, camcorders, portable information terminals, and tablet personal computers), desktop computers, televisions, advertising billboards, display devices for car dashboards, head up displays (HUDs), etc. For convenience, display devices may be manufactured using mother substrates. A plurality of patterns for display devices may be formed on a mother substrate and cut into separate display devices using a cutting instrument, such as a cutting wheel or a laser apparatus. During a cutting process, stress may be applied to the mother substrate that may cause the mother substrate to be damaged.

The above information disclosed in this Background section is only for enhancement of understanding of the background of the inventive concept, and, therefore, it may contain information that does not form the prior art that is already known to a person of ordinary skill in the art.

SUMMARY

One or more exemplary embodiments provide a display device that may prevent (or at least reduce) damage to a substrate.

Additional aspects will be set forth in the detailed description which follows, and, in part, will be apparent from the disclosure, or may be learned by practice of the inventive concept.

According to one or more exemplary embodiments, a display device includes a substrate, an encapsulation portion on the substrate, a seal portion between the substrate and the encapsulation portion, and at least one dummy seal portion around the seal portion. The substrate and the encapsulation portion at least partially overlap each other in a first direction perpendicular to a surface of the substrate. The dummy seal portion is, when viewed in the first direction, arranged in an area between an edge of the seal portion and a boundary line of an overlapping area of the substrate and the encapsulation portion.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
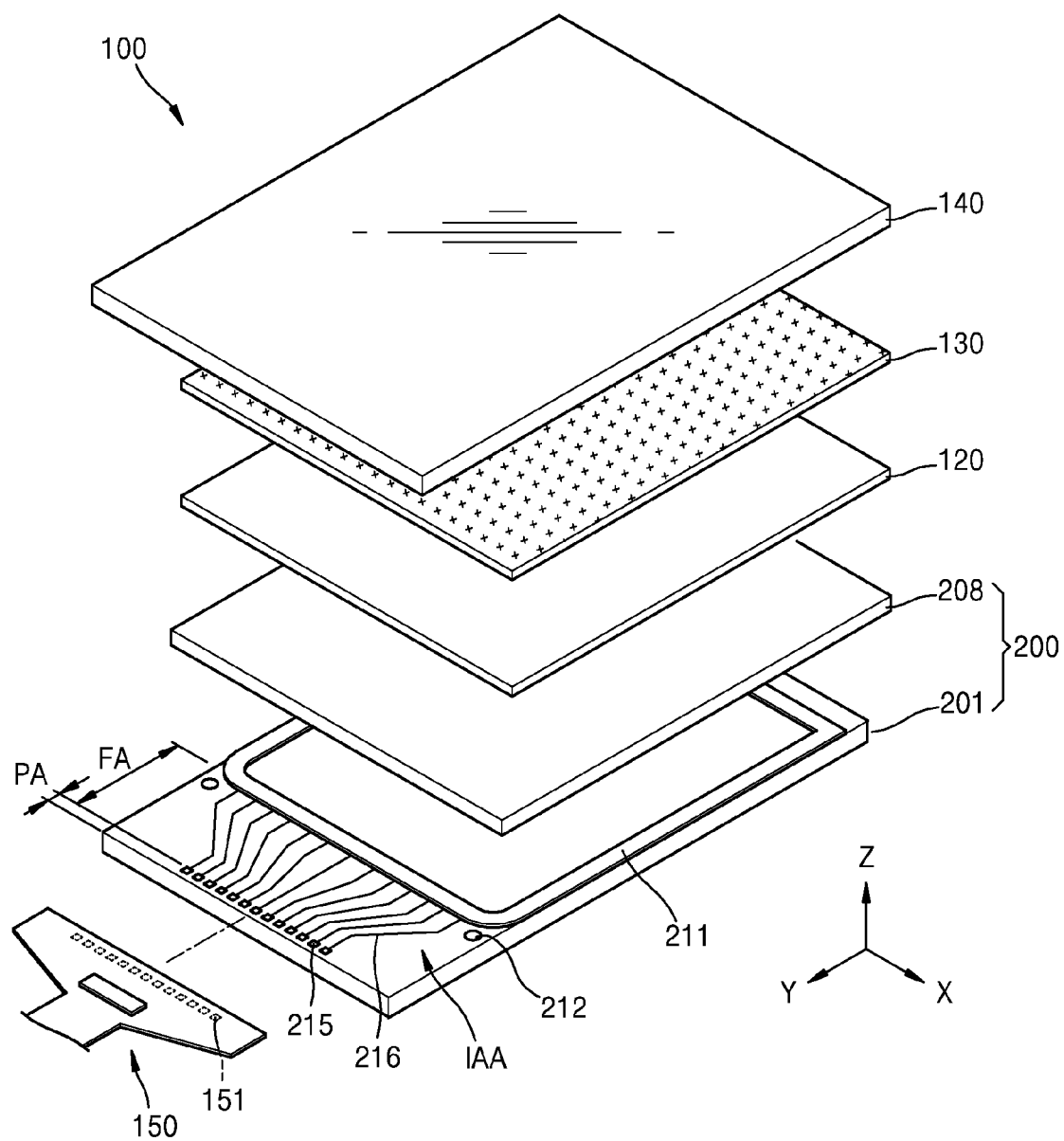
FIG. 1 is an exploded perspective view of a display device, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
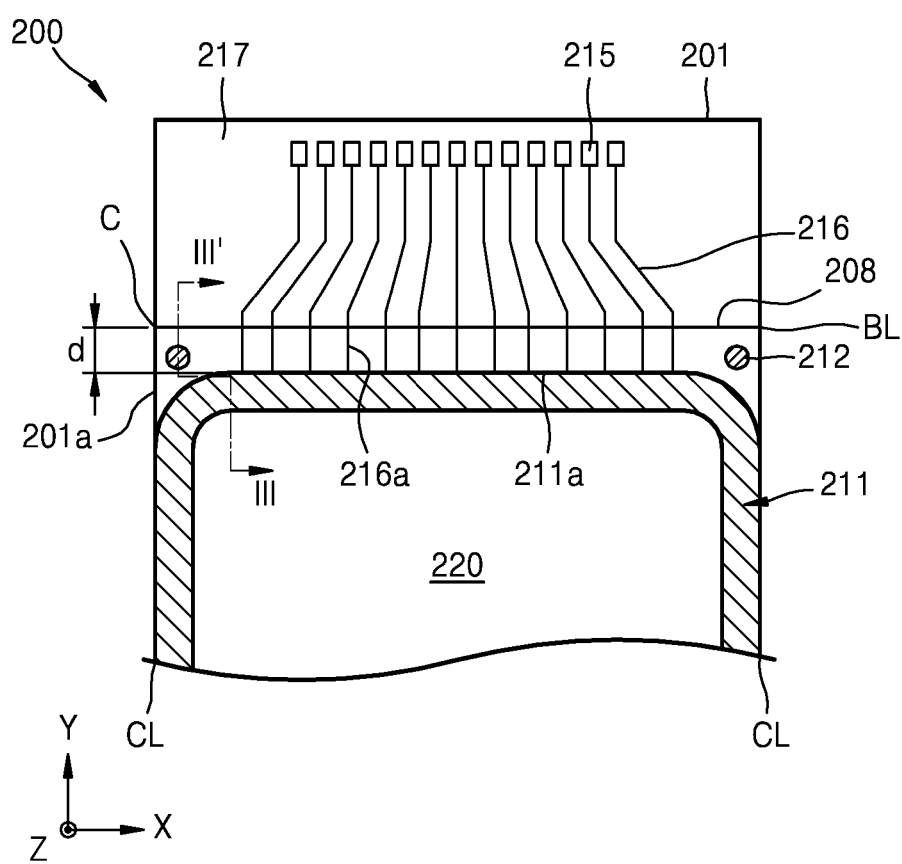
FIG. 2 is a partially enlarged plan view of a portion of the display panel of FIG. 1, according to one or more exemplary embodiments.

FIG. 1 is an exploded perspective view of a display device, according to one or more exemplary embodiments. FIG. 2 is a partially enlarged plan view of a portion of a display panel of the display device of FIG. 1, according to one or more exemplary embodiments.

Figure 3:
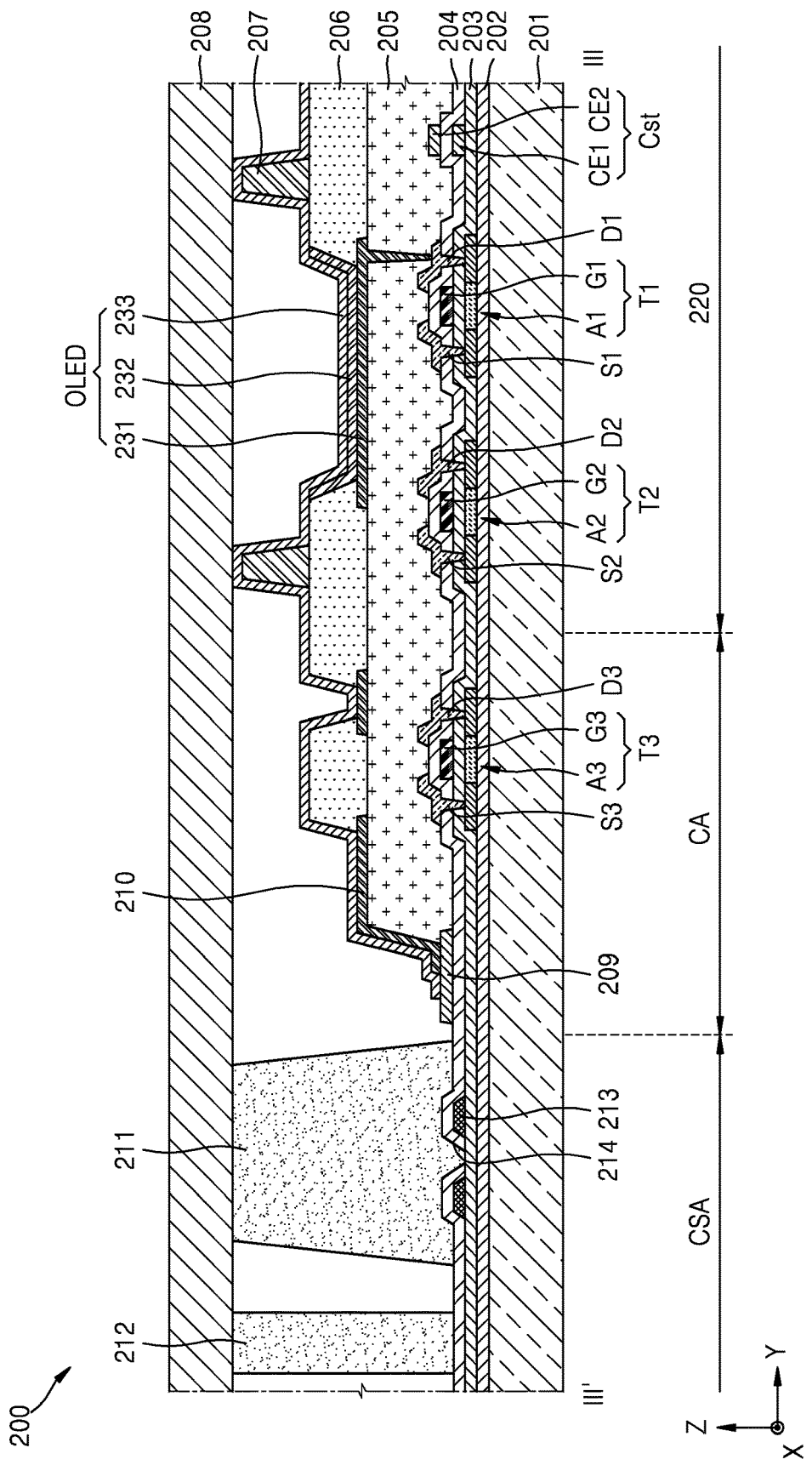
FIG. 3 is a cross-sectional view taken along sectional line III-III' of the display panel of FIG. 2, according to one or more exemplary embodiments.

Referring to FIGS. 1 to 3, a display device 100 may include a display panel 200. For descriptive and illustrative convenience, the display device 100 will be described as an organic light-emitting display device (OLED). It is contemplated, however, that the display device 100 may be any suitable display device for forming an image using power, such as, for example, a liquid crystal display device (LCD), a field emission display device (FEDs), an electronic paper display device (EPD), etc.

The display panel 200 may include a substrate 201 and an encapsulation portion 208 arranged on the substrate 201. A seal portion 211 may be arranged between the substrate 201 and the encapsulation portion 208. The seal portion 211 may be arranged on surfaces of the substrate 201 and the encapsulation portion 208 that face each other. The seal portion 211 may be formed along edges of the substrate 201 and the encapsulation portion 208. Any one of the substrate 201 and the encapsulation portion 208 may be outwardly extended to be longer than the other, and, as such, exposed to the outside. For example, one side of the substrate 201 may be exposed, in a first direction (e.g., Y direction), outside a boundary line BL of an area where the substrate 201 and the encapsulation portion 208 overlap each other. An exposed area 217 may be an inactive area IAA. Additionally or alternatively, one side of the encapsulation portion 208 may be exposed.

The inactive area IAA may include a pad area PA where a plurality of pad terminals 215 are patterned and a fan-out area FA where a plurality of signal lines 216 are patterned may be arranged. Each pad terminal 215 is connected to a corresponding signal line 216 and may be electrically connected to a drive terminal 151 of a driving portion 150, which may be formed as a chip-on-film (COF) component.

The signal lines 216 may be electrically connected to elements of an active area 220. The active area 220 may be an area for displaying an image, however, other active functions may be provided in association with the active area 220, such as, for instance, a touch sensing function, etc.

A touch sensing unit (or touch sensor) 120 may be arranged on the encapsulation portion 208. The touch sensing unit 120 may be an "on-cell" touch sensing unit formed by patterning a touch screen pattern on the encapsulation portion 208. It is also contemplated that the touch sensing unit 120 may be integrally formed with the encapsulation portion 208, but exemplary embodiments are not limited thereto or thereby. A polarizing layer 130 may be arranged on the touch sensing unit 120. The polarizing layer 130 may prevent (or at least reduce) external light from being reflected from the active area 220.

A window cover 140 for protecting the display panel 200, the touch sensing unit 120, and the polarizing layer 130 may be arranged on the polarizing layer 130. The window cover 140 may be formed of glass having rigidity or a film having flexibility. An exemplary internal structure of the display panel 200 is described below with reference to FIG. 3.

FIG. 3 is a cross-sectional view taken along sectional line III-III' of the display panel of FIG. 2, according to one or more exemplary embodiments.

The display panel 200 may include the substrate 201 and the encapsulation portion 208 arranged on the substrate 201. The substrate 201 may be a glass substrate having rigidity or a plastic substrate. It is also contemplated that the substrate 201 may be a film having flexibility. The substrate 201 may be transparent, opaque, or semitransparent. The active area 220, a circuit area CA extending out of the active area 220, and a cell seal area CSA extending out of the circuit area CA are arranged on the substrate 201.

As previously mentioned, the active area 220 may include an area for displaying an image, in which a display device, for example, an organic light-emitting display device (OLED), may be arranged. A plurality of circuit wires (or transmission lines) for transmitting electric signals to the elements in the active area 220 may be arranged in the circuit area CA. The seal portion 211 for sealing an inner space between the substrate 201 and the encapsulation portion 208 may be arranged in the cell seal area CSA.

A barrier film 202 may be arranged on the substrate 201. The barrier film 202 may planarize a surface of the substrate 201 and prevent (or at least reduce) intrusion of moisture or external air. The barrier film 202 may be an inorganic film and may be a single layer film or a multilayer film.

A plurality of thin film transistors T1 and T2 and a storage capacitor Cst may be arranged in the active area 220. In one or more exemplary embodiments, a first thin film transistor T1 may be a driving thin film transistor, and a second thin film transistor T2 may be a switching thin film transistor. Exemplary embodiments, however, are not limited thereto or thereby. It is also contemplated that additional thin film transistors and/or storage capacitors may be arranged in the active area 220.

The first thin film transistor T1 may include a first semiconductor layer A1, a first gate electrode G1, a first source electrode S1, and a first drain electrode D1. The second thin film transistor T2 may include a second semiconductor layer A2, a second gate electrode G2, a second source electrode S2, and a second drain electrode D2.

The first and second semiconductor layers A1 and A2 may be arranged on the barrier film 202. The first and second semiconductor layers A1 and A2 may include at least one of amorphous silicon, polysilicon, and an organic semiconductor material. It is also contemplated that the first and second semiconductor layers A1 and A2 may be formed of an oxide semiconductor material. The first and second semiconductor layers A1 and A2 may include a channel region that spaces a source region from a drain region. For instance, the source region and the drain region may be arranged at opposing sides of the channel region and may be doped with impurities.

The gate insulating film 203 may be arranged on the first and second semiconductor layers A1 and A2. The gate insulating film 203 may be an inorganic film and may be a single layer film or a multilayer film. The first and second gate electrodes G1 and G2 may be arranged on the gate insulating film 203. The first and second gate electrodes G1 and G2 may be formed of a conductive material, such as a conductive metal material. For example, the first and second gate electrodes G1 and G2 may include at least one of molybdenum (Mo), aluminum (Al), copper (Cu), and titanium (Ti). It is contemplated, however, that any suitable material may be utilized in association with exemplary embodiments. The first and second gate electrodes G1 and G2 may be a single layer film or a multilayer film.

An interlayer insulating film 204 may be arranged on the first and second gate electrodes G1 and G2. The interlayer insulating film 204 may be an inorganic film. The interlayer insulating film 204 may be a single layer film or a multilayer film. The first and second source electrodes S1 and S2 and the first and second drain electrodes D1 and D2 may be arranged on the interlayer insulating film 204. Contact holes may be formed by removing parts of the gate insulating film 203 and parts of the interlayer insulating film 204. In this manner, the first and second source electrodes S1 and S2 and the first and second drain electrodes D1 and D2 may be electrically connected to corresponding source regions and drain regions of the first and second semiconductor layers A1 and A2 via the contact holes.

The first and second source electrodes S1 and S2 and the first and second drain electrodes D1 and D2 may be formed of a conductive material, such as a conductive metal material. The first and second source electrodes S1 and S2 and the first and second drain electrodes D1 and D2 may include at least one Mo, Al, Cu, and Ti. It is contemplated, however, that any suitable material may be utilized in association with exemplary embodiments. The first and second source electrodes S1 and S2 and the first and second drain electrodes D1 and D2 may be single layer films or multilayer films. For example, the first and second source electrodes S1 and S2 and the first and second drain electrodes D1 and D2 may have a stack structure of Ti/Al/Ti.

A protective film 205 may be arranged on the first and second source electrodes S1 and S2 and the first and second drain electrodes D1 and D2. The protective film 205 may be an organic film or an inorganic film. The protective film 205 may be (or include) a passivation film and/or a planarization film. In this manner, any one of the passivation film and the planarization film may be omitted.

The storage capacitor Cst may include a first capacitor electrode CE1, a second capacitor electrode CE2, and a dielectric layer disposed between the first and second capacitor electrodes CE1 and CE2. For instance, the dielectric layer may correspond to the interlayer insulating film 204. The first capacitor electrode CE1 may be formed of the same material and in the same layer as the first and second gate electrodes G1 and G2. The second capacitor electrode CE2 may be formed of the same material and in the same layer as the first and second source electrodes S1 and S2 and the first and second drain electrodes D1 and D2. The protective film 205 may cover the second capacitor electrode CE2.

The first thin film transistor T1 may be electrically connected to an organic light emitting diode OLED. The organic light emitting diode OLED may be arranged on the protective film 205. The organic light emitting diode OLED may include a first electrode 231, an intermediate layer 232, and a second electrode 233.

The first electrode 231 is a pixel electrode and may be formed of various conductive materials. For instance, the first electrode 231 may include a transparent electrode or a reflective electrode. When the first electrode 231 is a transparent electrode, the first electrode 231 may include a transparent conductive film. When the first electrode 231 is a reflective electrode, the first electrode 231 may include a reflective film and a transparent conductive film arranged on the reflective film.

A pixel defining layer 206 may be arranged on the protective film 205. The pixel defining layer 206 may cover a portion of the first electrode 231. The pixel defining layer 206 defines a light-emitting area for each pixel (or sub-pixels) by encompassing an edge of the first electrode 231. In this manner, the first electrode 231 may be patterned for each sub-pixel, and the pixel defining layer 206 may include corresponding patterned regions overlapping the sub-pixel patterns of the first electrode 231. The pixel defining layer 206 may be an organic film and may be a single layer film or a multilayer film.

An intermediate layer 232 may be arranged on the first electrode 231 in an area exposed by etching a portion of the pixel defining layer 206. The intermediate layer 232 may include an organic emissive layer. It is also contemplated that the intermediate layer 232 may include an organic emissive layer and may further include at least one of a hole injection layer (HIL), a hole transport layer (HTL), an electron transport layer (ETL), and an electron injection layer (EIL). In one or more exemplary embodiments, the intermediate layer 232 may further include various functional layers, in addition to the organic emissive layer.

The second electrode 233 may be arranged on the intermediate layer 232. The second electrode 233 may be a counter electrode. The second electrode 233 may include a transparent electrode or a reflective electrode. When the second electrode 233 is a transparent electrode, the second electrode 233 may include a metal film and a transparent conductive film arranged on the metal film. When the second electrode 233 is a reflective electrode, the second electrode 233 may include a metal film.

According to one or more exemplary embodiments, a plurality of sub-pixels may be formed on the substrate 201. For example, each sub-pixel may emit a red color, a green color, a blue color, or a white color. It is contemplated, however, that exemplary embodiments are not limited thereto or thereby. In this manner, any suitable color may be utilized in association with exemplary embodiments.

In one or more exemplary embodiments, a spacer 207 may be further arranged around a sub-pixel. The spacer 207 may prevent (or at least reduce) deterioration of display properties from external shocks. The encapsulation portion 208 may be coupled to the substrate 201. The encapsulation portion 208 may protect the OLED and other elements from moisture or external air. The encapsulation portion 208 may be a glass substrate having rigidity, a plastic substrate, or a film having flexibility.

Various circuit patterns, for example, a power supply pattern, an anti-electrostatic pattern, and other circuit patterns may be formed in the circuit area CA. In one or more exemplary embodiments, a third thin film transistor T3 may be arranged in the circuit area CA. The third thin film transistor T3 may be a driving thin film transistor. The third thin film transistor T3 may include a third semiconductor layer A3, a third gate electrode G3, a third source electrode S3, and a third drain electrode D3. The third thin film transistor T3 may have the same stacked structure as the first thin film transistor T1 and the second thin film transistor T2, but exemplary embodiments are not limited thereto or thereby.

A circuit wiring 210 may be arranged in the circuit area CA. The circuit wiring 210 may be arranged on the protective film 205. The circuit wiring 210 may be formed of the same material as the first electrode 231, however, exemplary embodiments are not limited thereto or thereby. The circuit wiring 210 may be electrically connected to the second electrode 233. The circuit wiring 210 may be connected to a power wiring 209. The power wiring 209 may be arranged on the interlayer insulating film 204. The power wiring 209 may be formed of the same material as the source electrode S3 and the drain electrode D3, but exemplary embodiments are not limited thereto or thereby. The power wiring 209 may be a wire through which an external power is applied. In one or more exemplary embodiments, the power wiring 209 may be a triple layered structure of Ti/Al/Ti. One end of the circuit wiring 210 may contact the power wiring 209. In one or more exemplary embodiments, at least a portion of the circuit wiring 210 may overlap the power wiring 209.

The seal portion 211 may be arranged in the cell seal area CSA. The seal portion 211 may be arranged between the substrate 201 and the encapsulation portion 208. The seal portion 211 may include frit glass. The frit glass may include oxide powder in glass powder. An organic material may be added to frit glass including oxide powder so that a paste in a gel state is formed and baked in a temperature range of about 300° C. to about 500° C. When the frit glass is baked, the organic material is extinguished into the air and the paste in a gel state is cured and the paste may be formed into a frit in a solid state.

According to one or more exemplary embodiments, a metal pattern layer 213 may be arranged in a lower portion of the seal portion 211. The metal pattern layer 213 may transfer heat to the seal portion 211 by absorbing heat from a laser or reflecting the laser. The metal pattern layer 213 may be formed of the same material and in the same layer as the third gate electrode G3, but exemplary embodiments are not limited thereto or thereby. The metal pattern layer 213 may be a single layer film or a multilayer film including, for instance, Au, Ag, Cu, Ni, Pt, Pd, Al, Mo, or Cr. The metal pattern layer 213 may be an alloy, such as Al:Nd or Mo:W.

An opening 214 may be arranged in the interlayer insulating film 204 covering the metal pattern layer 213. The opening 214 may be formed to increase a contact area between the interlayer insulating film 204 and the seal portion 211. In this manner, a combination strength between the interlayer insulating film 204 and the seal portion 211 may be improved.

With continued referenced to FIGS. 1 to 3, the seal portion 211 may be arranged on opposing surfaces of the substrate 201 and the encapsulation portion 208 that facing each other. The seal portion 211 may be formed along an area in which the substrate 201 and the encapsulation portion 208 overlap each other. In this manner, the seal portion 211 may encompass an edge of the active area 220. At least one dummy seal portion 212 may be arranged around the seal portion 211. For instance, the dummy seal portion 212 may be arranged, as seen in FIG. 2, between the seal portion 211 and the boundary line BL. The dummy seal portion 212 may be formed of the same material as the seal portion 211. In one or more exemplary embodiments, the dummy seal portion 212 may include frit glass.

A cutting line CL may be arranged on the seal portion 211. The cutting line CL may be a cutting portion for splitting the substrate 201 into a plurality of separate display devices. For manufacturing convenience, the substrate 201 may be a mother substrate. As such, a pattern corresponding to each display device may be formed on the substrate 201, and then the substrate 201 may be cut into separate display devices using at least one of a cutting wheel, a laser device, or the like.

According to one or more exemplary embodiments, the display panel 200 may be cut on the seal portion 211 to reduce dead space. The cutting line CL may be located in an area in which the substrate 201, the encapsulation portion 208, and the seal portion 211 overlap one another in a perpendicular direction to the display panel 200, such as a second direction (e.g., the Z direction), which may be perpendicular to the first direction and a third direction (e.g., the X direction). The display panel 200 may be cut along the cutting line CL. The cutting line CL may correspond to an edge 201a of the substrate 201.

While the display panel 200 is being cut along the cutting line CL, an inflection point may be generated at a boundary between an area where the seal portion 211 is arranged and an area where the seal portion 211 is not arranged with respect to the boundary line BL in the area where the substrate 201 and the encapsulation portion 208 overlap each other. In this manner, the display panel 200 may be damaged at (or around) the boundary line BL.

According to one or more exemplary embodiments, the dummy seal portion 212 may be arranged around the boundary line BL in the area where the substrate 201 and the encapsulation portion 208 overlap each other to improve a cutting defect that might otherwise occur due to the existence of the seal portion 211. The dummy seal portion 212 may be arranged outside the seal portion 211. For instance, the dummy seal portion 212 may be arranged in an area defined by a distance d between an outer edge 211a of the seal portion 211 and the boundary line BL in the area where the substrate 201 and the encapsulation portion 208 overlap each other. In one or more exemplary embodiments, the dummy seal portion 212 may be arranged at (or near) a corner C of the area where the substrate 201 and the encapsulation portion 208 overlap each other.

At least a portion 216a of each of the signal lines 216 may be arranged in the area defined by the distance d between the outer edge 211a of the seal portion 211 and the boundary line BL in the area where the substrate 201 and the encapsulation portion 208 overlap each other. In other words, the area defined by the distance d may be an area where the portion 216a of each of the signal lines 216 drawn from the active area 220 and the circuit area CA are arranged. For example, the area defined by the distance d may be a space for escaping thermal deformation of the signal lines 216. Also, the distance d may be an allowable space used when the substrate 201 and the encapsulation portion 208 are combined with each other with respect to the seal portion 211 disposed therebetween. To this end, the signal lines 216 may be arranged in the first direction (e.g., Y direction) of the display panel 200 across the boundary line BL of the area where the substrate 201 and the encapsulation portion 208 overlap each other.

According to one or more exemplary embodiments, the dummy seal portion 212 may be arranged inside the cutting line CL. In one or more exemplary embodiments, the dummy seal portion 212 may be spaced apart from the seal portion 211. The dummy seal portion 212 may have an island shape when viewed in the second direction (e.g., Z direction). When the display panel 200 is rectangular when viewed in the second direction, the seal portion 211 may have a rectangular band shape encompassing the active area 220 when viewed in the second direction, and the dummy seal portion 212 may have at least one dot pattern spaced apart from the seal portion 211 when viewed in the second direction. Given that the dummy seal portion 212 may be arranged close to the cutting line CL, a cutting defect due to a step between the area where the seal portion 211 is arranged and the area where the seal portion 211 is not arranged when the display panel 200 is cut along the cutting line CL may be prevented or reduced. In one or more exemplary embodiments, the dummy seal portion 212 may be arranged between the signal lines 216 and the cutting line CL. For example, the dummy seal portion 212 may be arranged between the outermost signal line of the signal lines 216 in the third direction (e.g., X direction) and the cutting line CL. It is noted, however, that the position of the dummy seal portion 212 may be changed in any suitable manner according to exemplary embodiments.

Figure 4:
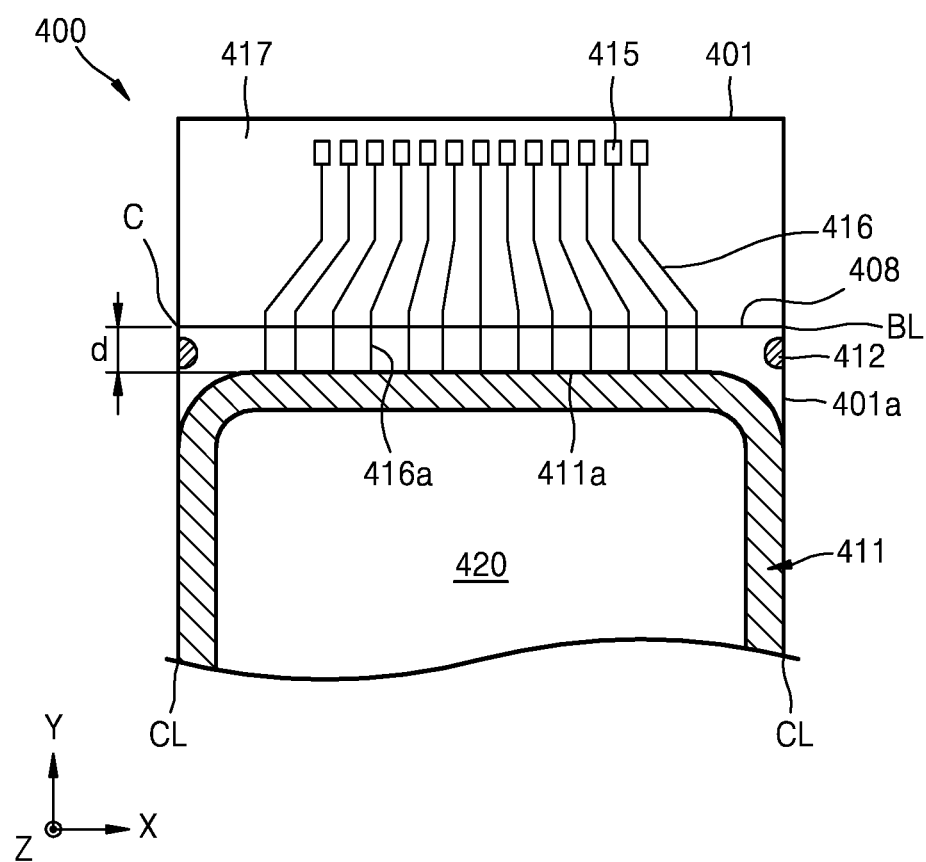
FIG. 4 is a partially enlarged plan view of a portion of a display panel, according to one or more exemplary embodiments.

FIG. 4 is a partially enlarged plan view of a portion of a display panel, according to one or more exemplary embodiments. The display panel 400 of FIG. 4 is similar to the display panel 200 of FIGS. 1 to 3, and, as such, duplicative descriptions will be primarily omitted to avoid obscuring exemplary embodiments.

Referring to FIG. 4, a display panel 400 may include a substrate 401 and an encapsulation portion 408. A plurality of pad terminals 415 may be arranged in an exposed area 417 of the substrate 401 extending out of an area where the substrate 401 and the encapsulation portion 408 overlap each other. The pad terminals 415 may be electrically connected to an active area 420 by a plurality of signal lines 416.

A seal portion 411 may be arranged between the substrate 401 and the encapsulation portion 408. The seal portion 411 may be formed in the area where the substrate 401 and the encapsulation portion 408 overlap each other. In one or more exemplary embodiments, the seal portion 411 encompasses an edge of the active area 420. The cutting line CL may be arranged on the seal portion 411. The cutting line CL may be located in an area where the substrate 401, the encapsulation portion 408, and the seal portion 411 overlap one another in a direction perpendicular to the display panel 400, e.g., the Z direction. The cutting line CL may correspond to an edge 401a of the substrate 401.

A dummy seal portion 412 may be arranged outside the seal portion 411. The dummy seal portion 412 may be arranged in an area defined by a distance d between an outer edge 411a of the seal portion 411 and the boundary line BL in the area where the substrate 401 and the encapsulation portion 408 overlap each other. In one or more exemplary embodiments, the dummy seal portion 412 may be arranged at (or near) a corner C of the area where the substrate 401 and the encapsulation portion 408 overlap each other.

At least a portion 416a of the signal lines 416 may be arranged in the area defined by a distance d between the outer edge 411a of the seal portion 411 and the boundary line BL in the area where the substrate 401 and the encapsulation portion 408 overlap each other. In one or more exemplary embodiments, the signal lines 416 may be arranged in a Y direction of the display panel 400 across the boundary line BL of the area where the substrate 401 and the encapsulation portion 408 overlap each other.

Unlike as described in association with display panel 200 of FIG. 2, at least a portion of the dummy seal portion 412 may contact the cutting line CL. For example, during a cutting process, a part of the dummy seal portion 412 may be cut with a part of the seal portion 411. In one or more exemplary embodiments, the part of the dummy seal portion 412 that is cut may be a tolerance generated when the dummy seal portion 412 is patterned using a seal patterning mask. In one or more exemplary embodiments, the dummy seal portion 412 may be arranged between the signal lines 416 and the cutting line CL.

Figure 5:
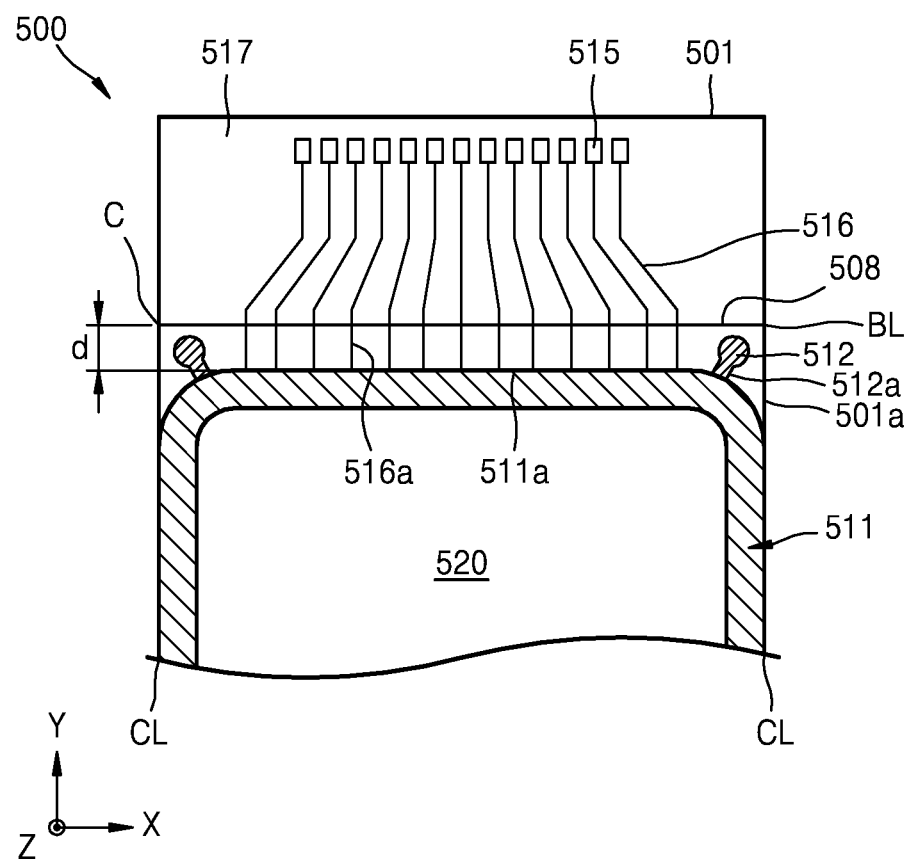
FIG. 5 is a partially enlarged plan view of a portion of a display panel, according to one or more exemplary embodiments.

FIG. 5 is a partially enlarged plan view of a portion of a display panel, according to one or more exemplary embodiments. The display panel 500 of FIG. 5 is similar to the display panel 200 of FIGS. 1 to 3 and the display panel 400 of FIG. 4, and, as such, duplicative descriptions will be primarily omitted to avoid obscuring exemplary embodiments.

Referring to FIG. 5, a display panel 500 may include a substrate 501 and an encapsulation portion 508. A plurality of pad terminals 515 may be arranged in an exposed area 517 of the substrate 501. The pad terminals 515 may be electrically connected to an active area 520 by a plurality of signal lines 516.

A seal portion 511 may be arranged between the substrate 501 and the encapsulation portion 508. In one or more exemplary embodiments, the seal portion 511 encompasses an edge of the active area 520. The cutting line CL may be arranged on the seal portion 511. The cutting line CL may correspond to an edge 501a of the substrate 501.

A dummy seal portion 512 may be arranged outside the seal portion 511. The dummy seal portion 512 may be arranged in an area defined by a distance d between an outer edge 511a of the seal portion 511 and the boundary line BL of an area where the substrate 501 and the encapsulation portion 508 overlap each other. At least a part 516a of each of the signal lines 516 may be arranged in the area defined by the distance d.

According to one or more exemplary embodiments, the dummy seal portion 512 may be connected to the seal portion 511. At least a part 512a of the dummy seal portion 512 may be connected to the outer edge 511a of the seal portion 511. The part 512a of the dummy seal portion 512 may be connected to the seal portion 511 as the dummy seal portion 512 having a dot shape extends during patterning using a seal patterning mask. In one or more exemplary embodiments, the dummy seal portion 512 may be arranged between the signal lines 516 and the cutting line CL.

A process of manufacturing separate display devices by cutting a display panel on a seal portion, such as seal portions 211, 411, or 511, will be described below.

FIG. 6A to 6G sequentially illustrate a process of manufacturing a plurality of unit display panels 700, according to one or more exemplary embodiments. FIG. 7 is a cross-sectional view of cutting a display panel on a seal portion, according to one or more exemplary embodiments.

Figure 6A:
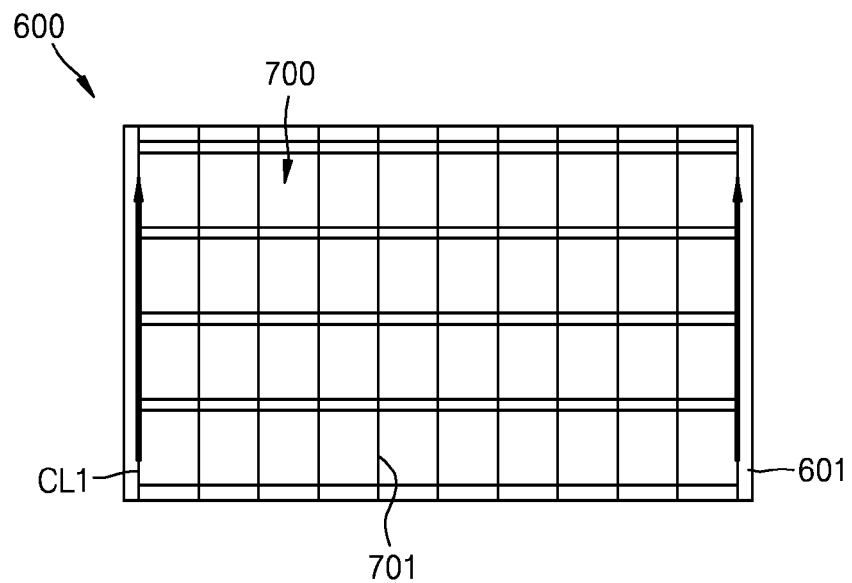
FIG. 6A is a plan view of cutting a mother substrate along a first cutting line of a first surface of the mother substrate, according to one or more exemplary embodiments.
Figure 7:
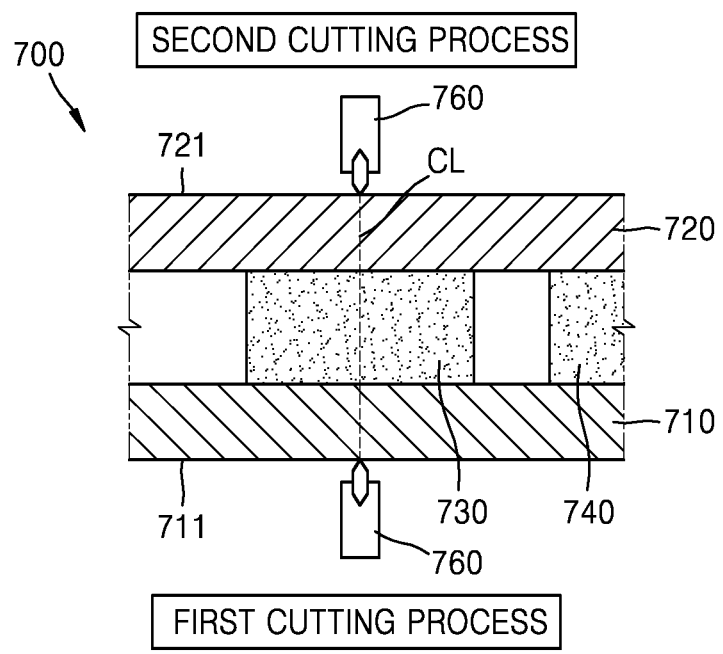
FIG. 7 is a cross-sectional view of cutting a display panel on a seal portion, according to one or more exemplary embodiments.

Referring to FIG. 6A, a mother substrate 600 is prepared. The mother substrate 600 may be a substrate used to simultaneously manufacture the unit display panels 700. The unit display panels 700 may be patterned on a first surface 601 of the mother substrate 600 and may be spaced apart from one another. Each of the unit display panels 700 may include a substrate 710 (see FIG. 7), on which a display portion, such as a thin film transistor or an organic light-emitting display device is patterned, and a seal substrate 720 (see FIG. 7) arranged above the substrate 710.

According to one or more exemplary embodiments, the unit display panels 700 are cut on the first surface 601 of the mother substrate 600 along first cutting lines CL1 extending in a vertical direction at horizontally opposite edges of the unit display panels 700. It is noted that the first surface 601 of the mother substrate 600 may be a surface on which the substrate 710 of FIG. 7 is arranged. In this manner, the unit display panels 700 may be cut in a thickness direction of the mother substrate 600 from the first surface 601 of the mother substrate 600 towards a second surface 602 (see FIG. 6C) of the mother substrate 600 opposing the first surface 601 in the thickness direction of the mother substrate 600. A depth of the cuts in the thickness direction may be about half the thickness of the mother substrate 600.

Figure 6B:
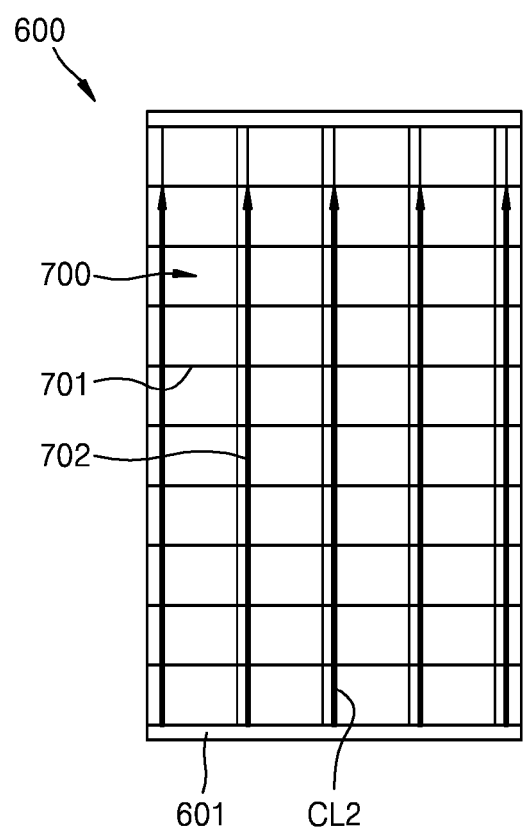
FIG. 6B is a plan view of cutting the mother substrate of FIG. 6A along a second cutting line of the first surface of the mother substrate, according to one or more exemplary embodiments.

Referring to FIG. 6B, the unit display panels 700 may be cut on the first surface 601 of the mother substrate 600 along second cutting lines CL2 extending in a horizontal direction and corresponding to second edges 702 of each of the unit display panels 700. In this manner, the unit display panels 700 may be cut in the thickness direction of the mother substrate 600 from the first surface 601 of the mother substrate 600 towards a second surface 602 (see FIG. 6C) of the mother substrate 600 opposing the first surface 601 in the thickness direction of the mother substrate 600. A depth of the cuts in the thickness direction may be about half the thickness of the mother substrate 600.

Figure 6C:
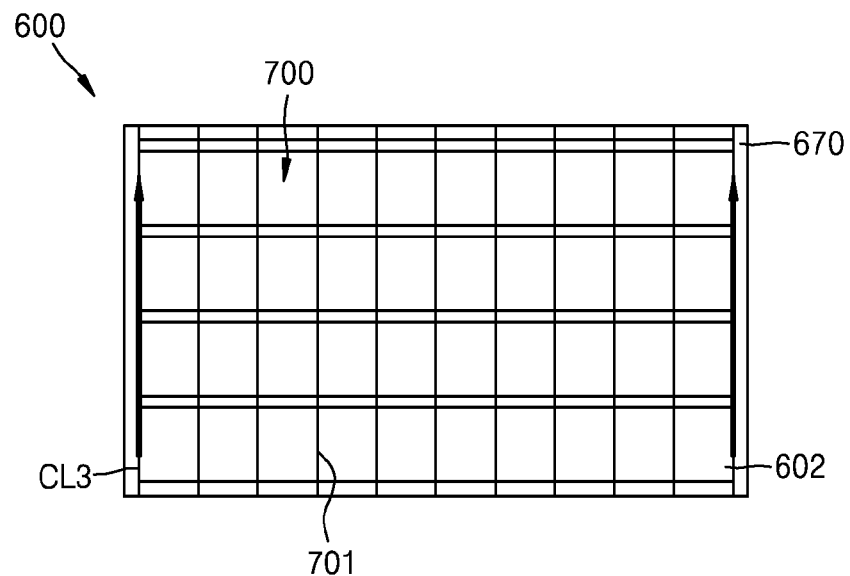
FIG. 6C is a plan view of cutting the mother substrate of FIG. 6B along a third cutting line of a second surface of the mother substrate, according to one or more exemplary embodiments.

Adverting to FIG. 6C, the unit display panels 700 are cut on the second surface 602 of the mother substrate 600 along third cutting lines CL3 extending in the vertical direction at the horizontally opposite edges of the unit display panels 700. The second surface 602 of the mother substrate 600 may be a surface opposite to the first surface 601 of the mother substrate 600. The second surface 602 of the mother substrate 600 may be a surface on which the seal substrate 720 of FIG. 7 is arranged. The third cutting line CL3 may correspond to (e.g., overlap) the first cutting lines CL1. In this manner, the unit display panels 700 may be cut in the thickness direction of the mother substrate 600 from the second surface 602 of the mother substrate 600 toward the first surface 601 of the mother substrate 600. A depth of the cuts in the thickness direction may be about half the thickness of the mother substrate 600. In this manner, the horizontally opposite peripheral edge portions 670 of the mother substrate 600 may be cut from a central portion of the mother substrate 600.

Figure 6D:
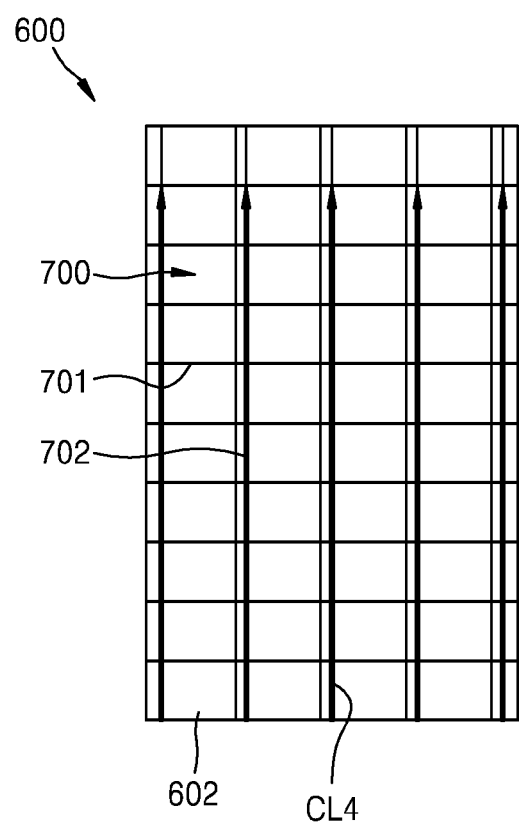
FIG. 6D is a plan view of cutting the mother substrate of FIG. 6C along a fourth cutting line of the second surface of the mother substrate, according to one or more exemplary embodiments.
Figure 6E:
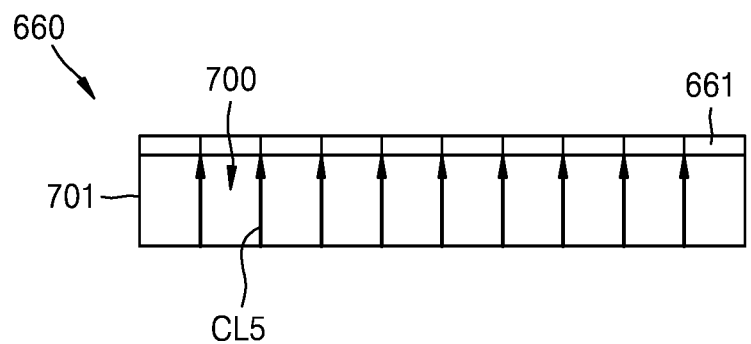
FIG. 6E is a plan view of cutting a unit stick of the mother substrate of FIG. 6D along a first cutting line of a first surface of the unit stick, according to one or more exemplary embodiments.

Referring to FIG. 6D, the unit display panels 700 are cut on the second surface 602 of the mother substrate 600 along fourth cutting lines CL4 extending in the horizontal direction and corresponding to a second edge 702 of each of the unit display panels 700. The fourth cutting lines CL4 may correspond to (e.g., overlap) the second cutting lines CL2. In this manner, the unit display panels 700 may be cut in the thickness direction of the mother substrate 600 from the second surface 602 of the mother substrate 600 toward the first surface 601 of the mother substrate 600. A depth of the cuts in the thickness direction may be about half the thickness of the mother substrate 600. In this manner, the mother substrate 600 may be split into a plurality of unit sticks 660 of unit display panels 700. An exemplary unit stick 660 of unit display panels 700 is illustrated in FIG. 6E. As seen in FIG. 6E, the unit stick 660 may include the unit display panels 700 arranged in a same line, e.g., row of unit display panels 700 of a matrix of unit display panels 700 formed on mother substrate 600.

As seen in FIG. 6E, the unit display panels 700 are cut on a first surface 661 of the unit sticks 660 along fifth cutting lines CL5 corresponding to the first edge 701 of each of the unit display panels 700. The first surface 661 of each of the unit sticks 660 may be a surface on which the substrate 710 of FIG. 7 is arranged. In other words, the first surface 661 of the unit sticks 660 may correspond to the first surface 601 of the mother substrate 600. In this manner, the unit display panels 700 may be cut in a thickness direction of each of the unit sticks 660 from the first surface 661 of each of the unit sticks 660 toward a second surface 662 (see FIG. 6F) of each of the unit sticks 660. A depth of the cuts in the thickness direction may be about half the thickness of the unit sticks 660.

Figure 6F:
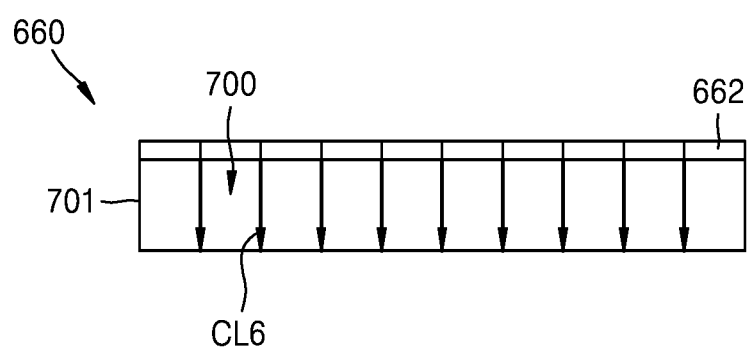
FIG. 6F is a plan view of cutting the unit stick of FIG. 6E along a second cutting line of a second surface of the unit stick, according to one or more exemplary embodiments.
Figure 6G:
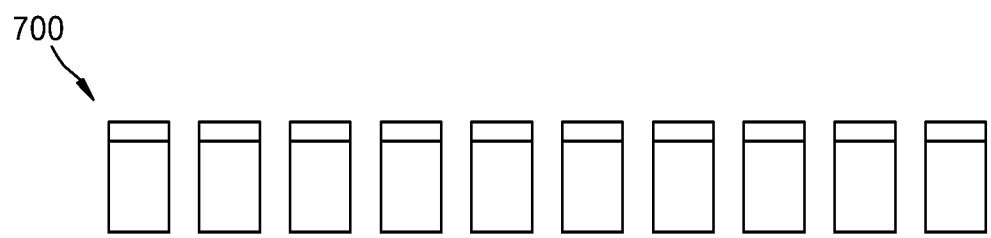
FIG. 6G is a plan view of the unit stick of FIG. 6F cut into separate display devices, according to one or more exemplary embodiments.

Referring to FIG. 6F, the unit display panels 700 are cut on a second surface 662 of each of the unit sticks 660 along sixth cutting lines CL6 corresponding to the first edge 701 of each of the unit display panels 700. The second surface 662 of each of the unit sticks 660 is a surface opposite the first surface 661 of each of the unit sticks 660. In other words, the second surface 662 of each of the unit sticks 660 may correspond to the second surface 602 of the mother substrate 600. The second surface 662 of each of the unit sticks 660 may be a surface on which the seal substrate 720 of FIG. 7 is arranged. In this manner, the unit display panels 700 may be cut in the thickness direction of each of the unit sticks 660 from the second surface 662 of each of the unit sticks 660 toward the first surface 661 of each of the unit sticks 660. A depth of the cuts in the thickness direction may be about half the thickness of the unit sticks 660. In this manner, separate unit display devices 700 may be manufactured, as illustrated in FIG. 6G.

As previously mentioned, FIG. 7 is a cross-sectional view of cutting a display panel on a seal portion, according to one or more exemplary embodiments.

Referring to FIG. 7, each of the unit display panels 700 may include the substrate 710 on which the display portion, which may include one or more thin film transistors and/or one or more organic light-emitting display devices, is patterned, and the seal substrate 720 arranged above the substrate 710. As described above with reference to FIGS. 6A to 6G, in a first cutting process, the unit display panels 700 may be cut on the substrate 710 using a cutting wheel 760 or any other suitable cutting mechanism, e.g., laser, etc. As seen in FIG. 7, the cutting wheel 760 cuts the substrate 710 in a thickness direction of the substrate 710 from a surface 711 of the substrate 710 towards seal portion 730. In this manner, about half of the thickness of the seal portion 730 may be cut in the thickness direction via the cutting wheel 760. Although FIG. 7 illustrates that the cutting wheel 760 starts cutting from a lower surface of the substrate 710 for convenience of explanation, the cutting wheel 760 may start cutting from an upper surface of the substrate 710.

As part of a second cutting process, the unit display panels 700 may be cut on the seal substrate 720 using the cutting wheel 760 or any other suitable cutting mechanism, such as a laser, etc. In this manner, the cutting wheel 760 cuts the seal substrate 720 in a thickness direction of the seal substrate 720 from a surface 721 of the seal substrate 720 towards the seal portion 730. As such, about the other half of the thickness of the seal portion 730 may be cut in the thickness direction by the cutting wheel 760. Accordingly, the unit display panels 700 may be completely cut on the seal portion 730. Given the presence of a dummy seal portion 740 arranged around (e.g., relatively close to) the cutting line CL, damage to the unit display panels 700 may be prevented or at least reduced.

According to one or more exemplary embodiments, a dummy seal portion arranged near a seal portion of a display device may be utilized to reduce (or prevent) damage to a substrate of the display device.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device comprising:
   a substrate;
   an encapsulation portion on the substrate;
   a seal portion between the substrate and the encapsulation portion; and
   at least one dummy seal portion adjacent to the seal portion,
   wherein:
      the substrate and the encapsulation portion at least partially overlap each other in a first direction perpendicular to a surface of the substrate;
      the dummy seal portion is, when viewed in the first direction, arranged in an area between an edge of the seal portion and a boundary line of an overlapping area of the substrate and the encapsulation portion;
      at least one other display device comprises the substrate; and
      a cut line to split the display device from the at least one other display device overlaps the seal portion when viewed in the first direction.

2. The display device of claim 1, wherein:
   the seal portion encompasses an active area of the substrate when viewed in the first direction; and
   the dummy seal portion is arranged, when viewed in the first direction, outside the active area and the seal portion.

3. The display device of claim 2, wherein, when viewed in the first direction, the dummy seal portion is arranged relatively closer to at least one corner of the overlapping area than the active area.

4. The display device of claim 3, wherein:
   the dummy seal portion is spaced apart from the seal portion when viewed in the first direction; and
   the dummy seal portion comprises at least one island shape.

5. The display device of claim 4, wherein the dummy seal portion comprises a plurality of patterned island shapes.

6. The display device of claim 3, wherein the dummy seal portion contacts an edge of the substrate.

7. The display device of claim 3, wherein the dummy seal portion is connected to the edge of the seal portion.

8. The display device of claim 2, wherein, when viewed in the first direction:
   an area of the substrate or the encapsulation portion extends beyond the boundary line;
   pad terminals are arranged in the area extending beyond the boundary line;
   signal lines are respectively connected to the pad terminals; and
   the signal lines cross the boundary line.

9. The display device of claim 8, wherein the area extending beyond the boundary line corresponds to an area of the substrate.

10. The display device of claim 8, wherein, when viewed in the first direction, respective portions of the signal lines are arranged in the area between the edge of the seal portion and the boundary line of the overlapping area of the substrate and the encapsulation portion.

11. The display device of claim 1, wherein, when viewed in the first direction, the substrate, the encapsulation portion, and the seal portion overlap one another along a portion of the cut line.

12. The display device of claim 1, wherein the cut line corresponds to an edge of the display device.

13. The display device of claim 1, wherein, when viewed in the first direction, the dummy seal portion is arranged between the cut line and the edge of the seal portion.

14. The display device of claim 13, wherein:
the dummy seal portion is spaced apart from the seal portion when viewed in the first direction; and
the dummy seal portion comprises at least one island shape.

15. The display device of claim 14, wherein the dummy seal portion comprises a plurality of patterned island shapes.

16. The display device of claim 13, wherein at least a part of the dummy seal portion is connected to the outer edge of the seal portion.

17. The display device of claim 1, wherein, when viewed in the first direction, the cut line extends through the dummy seal portion.

18. The display device of claim 1, wherein the substrate comprises:
an active area to display an image;
a circuit area extending from the active area, the circuit area comprising circuit wiring; and
a cell seal area extending from the circuit area, the cell seal area comprising the seal portion and the dummy seal portion.

19. The display device of claim 1, wherein the dummy seal portion comprises frit glass.

20. A display device comprising:
a substrate;
an encapsulation portion overlapping at least a portion of the substrate in a first direction perpendicular to a surface of the substrate;
a first insulating layer between the encapsulation portion and the substrate;
a second insulating layer between the encapsulation portion and the first insulating layer, the second insulating layer comprising an opening exposing a portion of the first insulating layer;
metal patterns between the first insulating layer and the second insulating layer, the opening in the second insulating layer being between the metal patterns;
a seal portion between the encapsulation portion and the second insulating layer, the seal portion overlapping the metal patterns in the first direction and extending into the opening in the second insulating layer; and
at least one dummy seal portion adjacent to the seal portion,
wherein:
the dummy seal portion is, when viewed in the first direction, arranged in an area between an edge of the seal portion and a boundary line of an overlapping area of the substrate and the encapsulation portion; and
the metal patterns are configured to transfer heat to the seal portion.

* * * * *